United States Patent
Holmes

(10) Patent No.: US 11,466,171 B2
(45) Date of Patent: Oct. 11, 2022

(54) COPPER NANOPARTICLES SUSPENDED IN TIN

(71) Applicant: The United States of America, as represented by the Secretary of the Navy, Crane, IN (US)

(72) Inventor: Harrison E. Holmes, Bloomington, IN (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/196,173

(22) Filed: Mar. 9, 2021

(65) Prior Publication Data
US 2022/0289995 A1     Sep. 15, 2022

(51) Int. Cl.
| | |
|---|---|
| C09D 11/52 | (2014.01) |
| B23K 35/30 | (2006.01) |
| B22F 1/054 | (2022.01) |
| B22F 1/145 | (2022.01) |
| B22F 10/18 | (2021.01) |
| B82Y 40/00 | (2011.01) |

(52) U.S. Cl.
CPC .............. *C09D 11/52* (2013.01); *B22F 1/054* (2022.01); *B22F 1/145* (2022.01); *B23K 35/302* (2013.01); *B22F 1/147* (2022.01); *B22F 10/18* (2021.01); *B22F 2301/10* (2013.01); *B22F 2301/30* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 10,254,499 B1 * | 4/2019 | Cohen | B23K 1/20 |
| 2009/0032139 A1 * | 2/2009 | Sakaue | B22F 1/0048 148/24 |
| 2020/0404795 A1 * | 12/2020 | Hoffmeyer | H05K 3/3485 |

FOREIGN PATENT DOCUMENTS

CN          102675960 A  *  9/2012

OTHER PUBLICATIONS

English machine translation of HU et al. (CN 102675960 A), accessed online from the Espacenet website; pp. 1-12. (Year: 2012).*

(Continued)

*Primary Examiner* — Katie L. Hammer
(74) *Attorney, Agent, or Firm* — Naval Surface Warfare Center, Crane Division

(57) ABSTRACT

Disclosed is a conductive ink composition and a manufacturing method thereof. The composition includes about 50 to about 99 wt % copper nanoparticles and about 1 to about 50 wt % tin. Copper nanoparticles are atomized and suspended in a tin bath, wherein the copper nanoparticles are evenly dispersed within the bath through sonification. The composition is cooled, extracted, and formed into a filament for use as a conductive ink. The ink has a resistivity of about $46.2 \times E-9 \; \Omega \cdot m$ to about $742.5 \times E-9 \; \Omega \cdot m$. Once in filament form, the tin-copper mix will be viable for material extrusion, thus allowing for a lower cost, electrically conductive traces to be used in additive manufacturing.

7 Claims, 1 Drawing Sheet

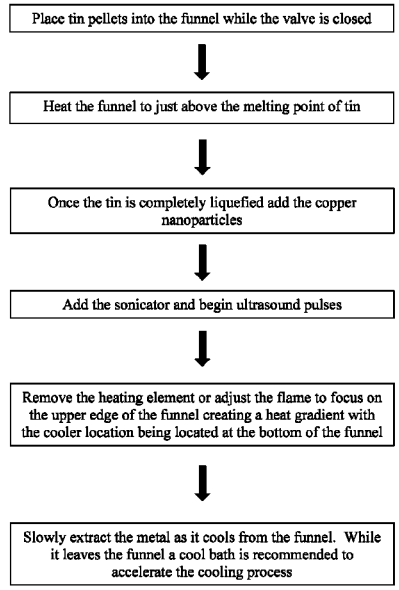

(56) References Cited

OTHER PUBLICATIONS

Kasap et al. "Part A 2. Electrical Conduction in Metals and Semiconductors," Springer Handbook of Electronic and Photonic Materials, 2nd edition. (2017). Germany: Springer International Publishing; accessed online at https://link.springer.com/content/pdf/10.1007%2F978-0-387-29185-7_2.pdf. (Year: 2017).*

* cited by examiner

Place tin pellets into the funnel while the valve is closed

Heat the funnel to just above the melting point of tin

Once the tin is completely liquefied add the copper nanoparticles

Add the sonicator and begin ultrasound pulses

Remove the heating element or adjust the flame to focus on the upper edge of the funnel creating a heat gradient with the cooler location being located at the bottom of the funnel

Slowly extract the metal as it cools from the funnel. While it leaves the funnel a cool bath is recommended to accelerate the cooling process

COPPER NANOPARTICLES SUSPENDED IN TIN

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,459) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The field of invention relates generally to printer inks for additive manufacturing. More particularly, it pertains to a printer ink that includes copper nanoparticles suspended in tin for creating low cost electrical circuit traces.

BACKGROUND

Presently, a major focus in additive manufacturing relates to the development of new printer inks. With each newly developed material, advantages are created, but the material in question might only be applicable to specific types of additive manufacturing. One area of particular interest is related to generating electrically conductive inks for printing circuit traces through material extrusion. This type of additive manufacturing is one of the more cost effective additive manufacturing processes, however, it is hampered by limited inks. The inks currently available either have an unacceptable resistance value or are made from silver. Silver has become the favorable ink material for a lot of additive manufacturing processes due to its high conductivity and ability to be printed in a foam-like state. The drawbacks of utilizing silver are that it is susceptible to material drift from high electrical currents, is susceptible to oxidation, and has a high cost. Copper is a preferred conductor for additive manufacturing, but its higher melting point makes it difficult to use. As such, a lack of electrically conductive inks exhibiting low resistance values drives up the cost of ink research and development.

SUMMARY OF THE INVENTION

Disclosed is a conductive ink composition and a manufacturing method thereof. The composition uses copper nanoparticles that are atomized and suspended in tin. The composition includes about 50 to about 99 wt % copper nanoparticles and about 1 to about 50 wt % tin. Tin is preferably used due to it having one of the lowest melting points of all metals and a lower electrical resistance than plastics. By creating a tin bath and using it as the medium, copper nanoparticles can be evenly dispersed within the bath through sonification before being formed into a filament. The composition is cooled, extracted, and formed into a filament for use as a conductive ink. The ink has a resistivity of about $46.2 \times E-9$ $\Omega*m$ to about $742.5 \times E-9$ $\Omega*m$.

According to an illustrative embodiment of the present disclosure, the present invention provides an ink utilizing copper nanoparticles suspended in tin as a conductor for additive manufacturing.

According to a further illustrative embodiment of the present disclosure, the present invention provides a method of atomizing and evenly dispersing copper nanoparticles within a tin bath through sonification before being extruded into a filament.

According to yet a further illustrative embodiment of the present disclosure, the present invention provides a printer ink utilizing materials that generate inks having lower costs and superior conductive properties as compared to currently known and available inks.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWING

The detailed description of the drawings particularly refers to the accompanying FIGURE in which:

FIG. 1 shows the method for manufacturing the additive manufacturing printer ink comprising copper nanoparticles suspended in tin.

DETAILED DESCRIPTION OF THE DRAWING

The embodiments of the invention described herein are not intended to be exhaustive or to limit the invention to precise forms disclosed. Rather, the embodiments selected for description have been chosen to enable one skilled in the art to practice the invention.

Generally, the present invention provides a conductive ink composition and a manufacturing method thereof utilizing copper nanoparticles suspended in tin. The manufacturing method for producing the printer ink comprises: adding white tin to a funnel; heating the funnel to melt the white tin; adding copper nanoparticles to the funnel; initiating ultrasound pulses; creating a heat gradient with a higher heat location at the upper edge of the funnel and a cooler location at the bottom of the funnel; and extracting a composition comprising copper nanoparticles suspended in tin from the funnel as the composition cools.

The raw materials required for manufacturing the ink include white tin, preferably in pellet form and copper nanoparticles. Alternatively, a solution that precipitates copper nanoparticles can be used. Equipment for manufacturing method the ink includes a sonicator (preferably one that works through a rod placed in a bath), a funnel with a control valve (preferably one that is capable of withstanding high temperatures and that conducts heat), and a heating element (a torch, an electric heat source, or the like).

FIG. 1 shows the method for manufacturing the additive manufacturing printer ink, comprising copper nanoparticles suspended in tin. In the first step, white tin is provided, preferably in a pellet form. Tin is a silvery-gray metallic element. The symbol is Sn, from the Latin stannum, and its atomic number is 50. It is usually found in the form of cassiterite which is an oxide mineral. Tin can be obtained in a variety of purities and in pellet form. The tin is placed in a funnel with a control valve. Preferably, the funnel conducts heat and is capable of withstanding high temperatures. Next, the funnel is heated until the tin contained therein liquefies, forming a bath. Once the tin is completely liquefied, copper nanoparticles are added to the funnel. Preferably, copper nanoparticles are obtained and used directly, however, if copper nanoparticles must be formed first from a solution, it is desirable to react the solution to produce a precipitate and then to vacuum oven off the remaining liquid. The copper nanoparticles are atomized and become suspended within the tin.

The next step is to add the sonicator and to begin ultrasound pulses. Sonication causes the copper nanoparticles to be evenly dispersed within the tin bath before they are extruded into a filament. Ultrasound is a technique used in metallurgy to produce stronger, lighter metal melts and as a method of cleaning. When used for cleaning, the ultrasound travels through a liquid medium in which cavitation removes contaminants from the object. The cavitation created by the ultrasound can vary depending on the medium, the frequency, and the strength of the signal. By carefully tuning these factors (as described in further detail below), the microcavitation will prevent the bath from boiling while thoroughly mixing the copper and tin. A bath of tin using ultrasound can distribute the copper nanoparticles while also degassing the suspension.

After sonication is complete, a single filament can be drawn by slowly draining through a cooling chamber. The heating element is removed or adjusted so that heat is focused on the upper edge of the funnel, which creates a heat gradient with a higher temperature at the upper edge of the funnel and a cooler temperature at the bottom of the funnel. Once the heat gradient is established, the composition is slowly removed from the funnel as it cools. The heat gradient enables the composition to be extruded into a filament as it is removed. In the preferred embodiment, a cool bath is recommended to accelerate the cooling process.

The above described method will be addressed in more detail through the following example, which assumes a 1 kilogram sample for the final suspension for all calculations. Table 1 illustrates a calculation using the resistivity of both tin and copper to determine the overall resistivity based on what percentage of the final volume each makes up. Based on the calculations, a mixture of 99% copper to 1% tin would yield results almost exactly the same as copper alone, while 85% copper to 15% tin would yield about double the resistivity. These calculations rely on a theoretical volume based on the density of the material and the weight of each contributing component.

TABLE 1 shows the resistivity by weight of tin-copper alloys.

|  | Density (g/cm^3) | resistivity (Ω*m) | cu/sn % | weight in g | Volume (cm^3) | volume % | total resistivity (Ω*m) |
|---|---|---|---|---|---|---|---|
| Copper | 8.94 | 16.8E−9 | 90% Cu | 900 | 100.671 | 0.880 | 27.9E−9 |
| Tin | 7.31 | 110.0E−9 | 10% Sn | 100 | 13.680 | 0.120 |  |
|  |  |  | 99% Cu | 990 | 110.738 | 0.968 | 17.6E−9 |
|  |  |  | 1% Sn | 10 | 1.368 | 0.012 |  |
|  |  |  | 85% Cu | 850 | 95.078 | 0.831 | 33.7E−9 |
|  |  |  | 15% Sn | 150 | 20.520 | 0.179 |  |
|  |  |  | 50% Cu | 500 | 55.928 | 0.489 | 74.0E−9 |
|  |  |  | 50% Sn | 500 | 68.399 | 0.598 |  |
|  |  |  | 75% Cu | 750 | 83.893 | 0.734 | 45.2E−9 |
|  |  |  | 25% Sn | 250 | 34.200 | 0.299 |  |

A basic model that takes into account the atomic structures can be derived using the Drude model and the crystal structure of both tin and copper. Equation 1 calculates resistivity using a combination of the Matthiessen Rule and Nordheim Rule.

$$\rho = \rho_{matrix} + CX(1-X) \qquad \text{Equation 1}$$

The Nordheim coefficient (C) is an empirically derived resistance value for copper-tin scatter. A Nordheim coefficient for solid copper as a solvent was used. To account for the use of copper nanoparticles, the resistivity coefficient was adjusted accordingly.

Table 2 shows the calculation based on the Drude model with different percentages of tin and copper yielding a final total resistivity shown on the right. As shown, the content of copper nanoparticles is about 50 to about 99 wt %, and the content of tin is about 1 to about 50 wt %. Currently, the best material extrusion conductive ink is Voxel8's silver ink with a bulk electrical resistivity around 3.0×E−7 Ω*m. All of the total resistivity values are shown in Table 2 and show that the inventive conductive ink composition has a resistivity of about 46.2×E−9 Ω*m to about 742.5×E−9 Ω*m. These values fall close to the value of the silver ink with some being theoretically better.

TABLE 2

Drude model of total resistivity.

|  | Density (g/cm^3) | Nardheim Coefficient | cu/sn % | % | Total Resistivity (Ω * m) |
|---|---|---|---|---|---|
| Copper | 8.94 | 2.9E−6 | 90% Cu | 0.9 | 278.5E−9 |
| Tin | 7.31 | resisitivity | 10% Sn | 0.1 |  |
|  |  | matrix (Ω * m) | 99% Cu | 0.99 | 46.2E−9 |
|  |  | 17.5E−9 | 1% Sn | 0.01 |  |
|  |  |  | 85% Cu | 0.85 | 387.3E−9 |
|  |  |  | 15% Sn | 0.15 |  |
|  |  |  | 50% Cu | 0.5 | 742.9E−9 |
|  |  |  | 50% Sn | 0.5 |  |
|  |  |  | 75% Cu | 0.75 | 561.3E−9 |
|  |  |  | 25% Sn | 0.25 |  |

In order to properly mix and degas the tin/copper mixture, ultrasound must be applied to the mixture. Ultrasound is also used in the process of atomizing particles in a solution. Starting with the Navier-Stokes equations and assuming spherical symmetry of cavitation bubbles in an infinite body of liquid the Rayleigh-Plesset equation (Equation 2) can be derived.

$$\frac{P_B(t) - P_\infty(t)}{\rho_L} = R\frac{d^2R}{dt^2} + \frac{3}{2}\left(\frac{dR}{dt}\right)^2 + \frac{4v_L}{R}\frac{dR}{dt} + \frac{2S}{\rho_L R} \qquad \text{Equation 2}$$

Equation 2 models how cavitation occurs in a liquid but it can also be used to derive Equation 3, which is the density of gas flow into the bubble as a function of time. By applying ultrasound to these bubbles, a pressure gradient can be formed within the bubble causing a ripple effect. The pressure gradient can pull gas from the cavitation allowing the gasses to flow from the liquid.

$$(R/3kT)\partial P/\partial t + P\partial R/(\partial tkT) = i(t) \quad \text{Equation 3}$$

Rearranging Equation 3 as a function of the unknown radii $(S(r)=4\pi r2)$ results in Equation 5. Using the assumptions made by Eskin, let the surface area be the unknown in the system of equations for bubble dynamics Equation 4 and density of gas flow into the pulsating bubble Equation 5.

$$\partial^2 S/\partial t^2 = -(\tfrac{1}{4})S(\partial S/\partial t)^2 + 2\pi/\rho[P(t)-P_0-P_s \sin \omega t] - 4\sigma\pi^{3/2}/S^{1/2} - 4\,\mu\dot{S}/S \quad \text{Equation 4}$$

$$3S^{3/2}\sqrt{\pi}kT(\partial P/\partial t) + PS^{1/2}/2\sqrt{\pi}kT(\partial S/\partial t) = t$$

Equation 5: wherein $P_s$ is the amplitude of sound pressure; p is the density of tin; $\sigma$ is the surface tension of the tin; $\mu$ is the viscosity of the tin; D is the diffusion coefficient; $C_0$ is the content of hydrogen in liquid; and T is the period of bubble pulsation Equations 4 and 5 were solved using numerical methods with initial conditions of $S(0)=S_0$, $P(0)=P_0$ and $S'(0)=0$. The result indicated that the ideal ultrasound pressure ranges from approximately 15 MPa to 25 MPa with pressures exceeding 25 MPa being subject to dramatic changes in pulse exposure time. Exposure time of the tin/copper bath ranges from about 60 seconds to 150 seconds.

Although the invention has been described in detail with reference to certain preferred embodiments, variations and modifications exist within the spirit and scope of the invention as described and defined in the following claims.

The invention claimed is:

1. A conductive ink composition comprising:
   atomized copper nanoparticles suspended in white tin;
   wherein the wt % of said atomized copper nanoparticles and said white tin is selected to produce a conductive ink composition having a resistivity of about $46.2\times E-9$ $\Omega$*m to about $742.5\times E-9$ $\Omega$*m;
   wherein said resistivity is calculated using a combination of the Matthiessen Rule and Nordheim Rule $\rho=\rho_{matrix}+CX(1-X)$.

2. The composition of claim 1, wherein the content of said atomized copper nanoparticles is about 90 wt % and the content of said white tin is about 10 wt %; and
   wherein said conductive ink composition has a resistivity of about $278.5\times E-9$ $\Omega$*m.

3. The composition of claim 1, wherein the content of said atomized copper nanoparticles is about 99 wt % and the content of said white tin is about 1 wt %; and
   wherein said conductive ink composition has a resistivity of about $46.2\times E-9$ $\Omega$*m.

4. The composition of claim 1, wherein the content of said atomized copper nanoparticles is about 85 wt % and the content of said white tin is about 15 wt %; and
   wherein said conductive ink composition has a resistivity of about $387.3\times E-9$ $\Omega$*m.

5. The composition of claim 1, wherein the content of said copper nanoparticles is about 50 wt % and the content of said tin is about 50 wt %; and
   wherein said conductive ink composition has a resistivity of about $742.5\times E-9$ $\Omega$*m.

6. The composition of claim 1, wherein the content of said copper nanoparticles is about 75 wt % and the content of said tin is about 25 wt %; and
   wherein said conductive ink composition has a resistivity of about $561.3\times E-9$ $\Omega$*m.

7. The composition of claim 1, wherein said composition is extruded into a filament.

* * * * *